United States Patent
Seo

(10) Patent No.: US 7,781,297 B2
(45) Date of Patent: Aug. 24, 2010

(54) SEMICONDUCTOR DEVICE AND METHOD OF FABRICATING THE SAME

(75) Inventor: Won Sun Seo, Gangwon-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 47 days.

(21) Appl. No.: 12/114,659

(22) Filed: May 2, 2008

(65) Prior Publication Data

US 2009/0197385 A1 Aug. 6, 2009

(30) Foreign Application Priority Data

Jan. 31, 2008 (KR) .................. 10-2008-0010119

(51) Int. Cl.
*H01L 21/20* (2006.01)
(52) U.S. Cl. ............... 438/387; 438/701; 257/E21.011; 257/E21.014
(58) Field of Classification Search .......... 438/387, 438/701; 257/E21.011, E21.014, E21.017, 257/E21.018, E21.02
See application file for complete search history.

(56) References Cited

U.S. PATENT DOCUMENTS

| 2006/0046419 | A1* | 3/2006 | Sandhu et al. ............... 438/386 |
| 2007/0232013 | A1* | 10/2007 | Manning et al. ............. 438/386 |
| 2008/0081431 | A1 | 4/2008 | Roh et al. |
| 2008/0242042 | A1 | 10/2008 | Kim et al. |

FOREIGN PATENT DOCUMENTS

| KR | 1020050000896 A | 1/2005 |
| KR | 1020050042624 A | 5/2005 |
| KR | 1020050059697 A | 6/2005 |

* cited by examiner

*Primary Examiner*—Caridad M Everhart
(74) *Attorney, Agent, or Firm*—Townsend and Townsend and Crew LLP

(57) ABSTRACT

The present invention discloses a semiconductor device and a method of manufacture thereof. The present invention prevents from leaning or collapsing in the subsequent dip-out process by making the bottom plate of adjacent capacitors to be connected each other and supported each other in patterning the conductive layer for the bottom plate of capacitor.

9 Claims, 7 Drawing Sheets

SEMICONDUCTOR DEVICE AND METHOD OF FABRICATING THE SAME

CROSS-REFERENCES TO RELATED APPLICATIONS

The priority of Korean patent application number 10-2008-0010119, filed on Jan. 31, 2008, which is incorporated by reference in its entirety, is claimed.

BACKGROUND OF THE INVENTION

The present invention relates to a semiconductor device, and more particularly, to a method of manufacturing a semiconductor device using a support pattern which supports the bottom plate of the capacitor in order to prevent a capacitor leaning phenomenon in the dip-out process.

Generally, the cell of the DRAM (Dynamic Random Access Memory) includes a capacitor for storing a charge, and a transistor that addresses the charge stored in the capacitor. As usual, the transistor that is formed on a semiconductor substrate includes a gate electrode that controls the flow of current between source/drain regions. The charge which is stored in the capacitor is accessed through the transistor.

Currently, as the integration density of semiconductor devices has increased, the area of the memory cell has also decreased considerably. In addition, as the memory cell area has decreased, the capacitor area that forms the memory cell has also decreased. Considering the read-out of cells, the soft error due to alpha particles, and the sensing margin of a sense amp, the capacitance should be 25 fF or more so that a DRAM might operate normally. The capacitance is in proportion to the dielectric constant of a dielectric that exists between the surface area of the electrode and the electrode.

The capacitance of capacitor can be expressed by the following Equation 1. In this case, $\in$ is a dielectric constant determined by the kind of dielectric layer that is positioned between two electrodes, d is a distance between two electrodes, and A indicates an effective surface area of two electrodes. As shown in Equation 1, as the dielectric constant $\in$ of the dielectric layer is increased, as the distance d between two electrodes is decreased, and as the surface area A of two electrodes is increased, the capacitance of a capacitor is increased.

$$C = \varepsilon \frac{A}{d} \qquad \text{[Equation 1]}$$

Accordingly, recently, a three dimensional capacitor electrode structure such as the concave structure, or the cylinder structure has been developed so as to enhance the effective area of a electrode.

The capacitor having the concave structure is formed, after forming a hole on an interlayer insulating layer, forming a bottom plate of a capacitor on the inside surface of the hole, and sequentially laminating the dielectric layer and a top plate on the surface of the bottom plate. However, it has been hard to secure enough electrostatic capacity which is required per cell in the limited cell area with the capacitor of the concave structure as the semiconductor device becomes more highly integrated. Therefore, the capacitor of the cylinder structure capable of providing the surface area which is greater than the capacitor of the concave structure was suggested.

In order to form the capacitor of the cylinder structure, a contact hole is made on the interlayer insulating layer, and the interlayer insulating layer is removed after the bottom plate of a capacitor is formed inside the contact hole, and then, the dielectric layer and the top plate are sequentially laminated onto the surface of the remaining bottom plate. The capacitor of the cylinder structure can use both of the inside and the outer surface of the bottom plate as the effective surface area of a capacitor. Therefore, the capacitor of the cylinder structure can have the electrostatic capacity which is greater than the capacitor of the concave structure.

In order to form the capacitor of such a cylinder structure, the dip-out process is essential, the dip-out process is performed with the wet method including a chemical solution.

However, the chemical solution causes a phenomenon where the structure of the cylinder type leans or collapses in the dip-out process. Particularly, in the case where the aspect ratio of the bottom plate for the storage node is large due to the integration level of the semiconductor device, the leaning and collapsing becomes conspicuous.

BRIEF SUMMARY OF THE INVENTION

Embodiments of the present invention are directed to prevent from leaning or tumbling down of the bottom plate in the subsequent dip-out process by connecting the bottom plates for the adjacent capacitors and supporting each other, in patterning the conductive layer for the bottom plate of capacitor. In addition, by removing a part of the top plate, the present invention maximizes the subsequent annealing effect and improves the characteristic of device.

According to an embodiment of the present invention, a method of fabricating a semiconductor device includes: forming a storage node contact holes in an interlayer insulating layer formed over a semiconductor substrate; forming a first conductive layer on the storage node contact holes and the interlayer insulating layer; forming a support region conductive layer which selectively connects storage node region conductive layers that is a part of the first conductive layer formed in the storage node contact holes; eliminating the interlayer insulating layer; successively forming a dielectric layer and a second conductive layer on the surface of the storage node region conductive layers and the support region conductive layers; and electrically isolating the storage node region conductive layer respectively.

The support region conductive layer connects the adjacent storage node region conductive layers by a predetermined number, and connects at least two storage node region conductive layers which are adjacent according to a first direction and a second direction which are perpendicular to each other. The interlayer insulating layer is eliminated with a dip-out process. The first conductive layer is formed with a TiN layer, the dielectric layer is formed with one of an oxide titanium $TiO_2$, a zirconium oxide $ZrO_2$, a hafnium oxide $HfO_2$, an aluminium oxide $Al_2O_3$ and combinations thereof, the second conductive layer is formed with one of a polysilicon, a titanium nitride TiN, and a ruthenium Ru and combinations thereof. The electrically isolating eliminates the support region conductive layer and the dielectric layer formed on the surface of the support region conductive layer and the second conductive layer.

According to another embodiment of the present invention, a method of fabricating a semiconductor device includes: forming a storage node contact holes on an interlayer insulating layer formed over a semiconductor substrate; forming a first conductive layer on the storage node contact holes and the interlayer insulating layer including a dummy region; forming a support region conductive layer which selectively connects storage node region conductive layers formed in the storage node contact holes among the first conductive layer except the dummy region; eliminating the interlayer insulating layer; successively forming a dielectric layer and a second conductive layer on the surface of the storage node region conductive layer, the conductive layer of the dummy region, and the support region conductive layer; and electrically isolating the storage node region conductive layer respectively.

The support region conductive layer connects the adjacent storage node region conductive layers by a predetermined number, and connects all the dummy storage node region conductive layers. The support region conductive layer, the conductive layer which is adjacent to the dummy region among the storage node region conductive layers connects with the dummy storage node region conductive layers. The electrically isolating eliminates the support region conductive layer and the second conductive layer formed on the surface of the support region conductive layer and the dielectric layer, while, in the eliminating the second conductive layer, the second conductive layer formed in the inside of the dummy storage node conductive layer and the second conductive layer formed in the outside of the dummy storage node conductive layer are isolated each other.

DESCRIPTION OF EMBODIMENTS

Figure 1:
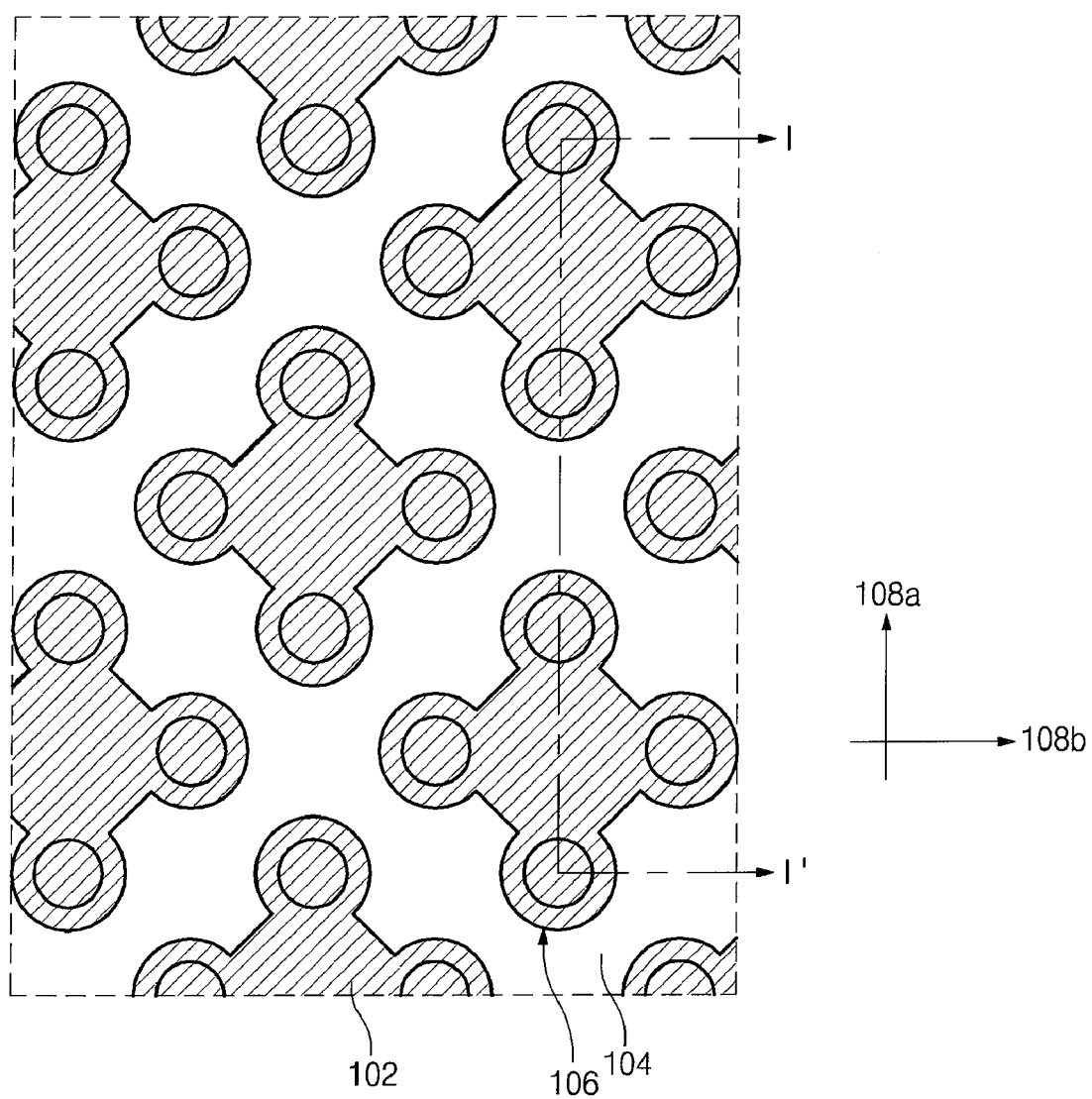
FIG. 1 is a drawing showing the patterning of the conductive layer for a bottom plate according to an embodiment of the present invention.

FIG. 1 is a drawing showing the patterning of the conductive layer for bottom plate according to an embodiment of the present invention.

The pattern of FIG. 1 includes a support region 102, an open region 104 and a storage node region 106.

The support region 102 shows the conductive layer region which connects the conductive layers of a plurality of adjacent storage node regions 106 in order to prevent the leaning and the collapsing of the bottom plate in the dip-out process.

The open region 104 shows the region in which the storage node regions 106 are not connected, that is, the region in which the conductive layer is removed.

In FIG. 1, the support region 102 connects four neighboring storage node regions 106 in a first direction and a second direction which are perpendicular to each other with two storage node regions for each direction.

FIGS. 2a to 2h are cross-sectional views along I-I' in FIG. 1 showing the manufacturing method of a semiconductor device according to an embodiment of the present invention.

Figure 2A:
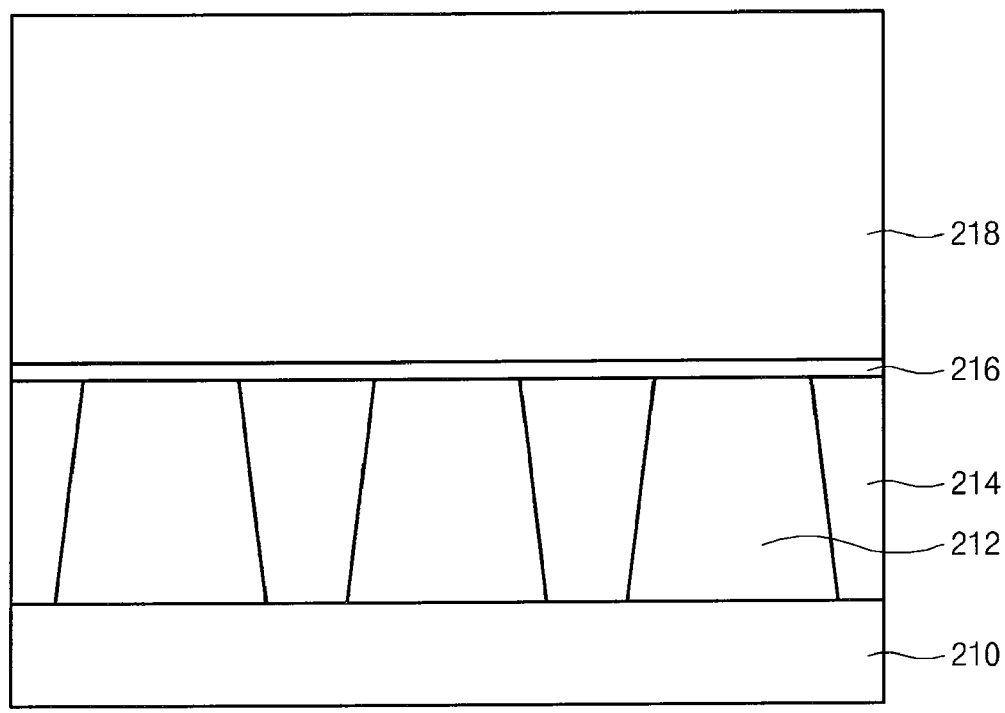
FIGS. 2a to 2g are cross-sectional views showing the manufacturing method of a semiconductor device according to an embodiment of the present invention.

Referring to FIG. 2a, a first interlayer insulating layer 212 is formed over a semiconductor substrate 210 including the lower portion structure such as a device isolation region, a source/drain region, a gate, and a landing plug. The first interlayer insulating layer 212 is then selectively etched to form a storage node contact plug 214.

Then, an etch stop layer 216 and a second interlayer insulating layer 218 are sequentially formed on the first interlayer insulating layer 212 and the storage node contact plug 214. At this time, the second interlayer insulating layer 218 may be formed with an oxide layer. The second interlayer insulating layer 218 may be formed with one of a phospho-silicate-glass (PSG) oxide layer, a tetra-ethyl-ortho-silicate (TEOS) oxide layer and combinations thereof.

Figure 2B:
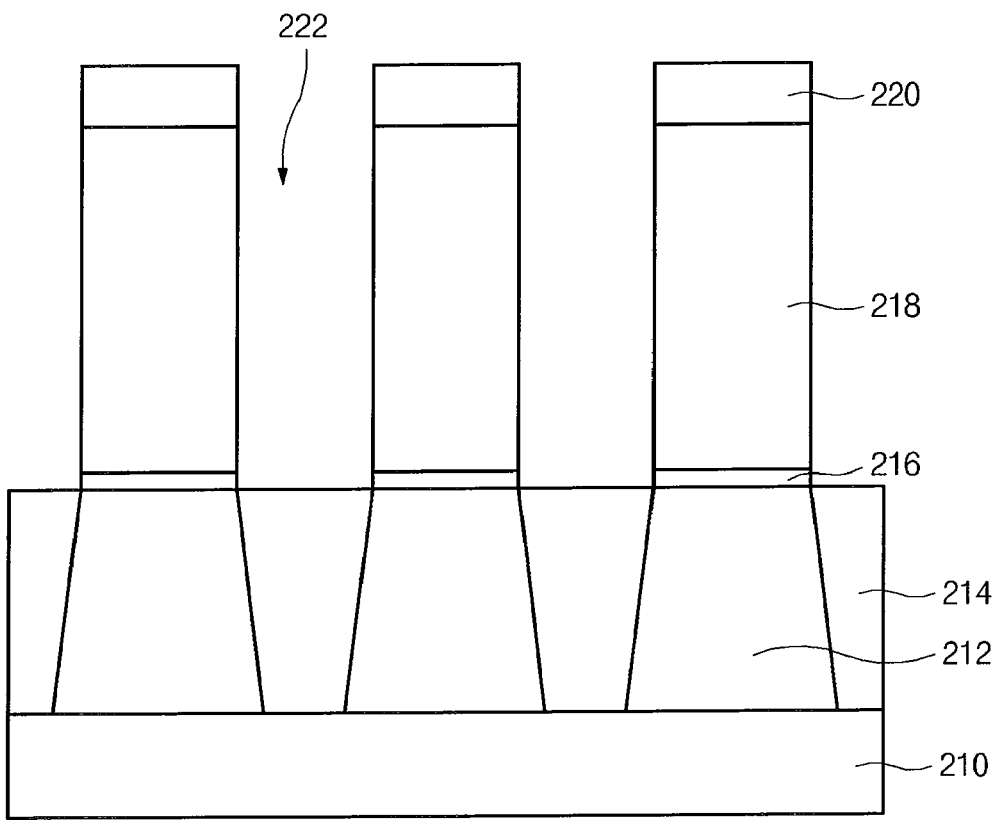

Referring to FIG. 2b, a mask pattern 220 defining the storage node region 106 of FIG. 1 is formed on the second interlayer insulating layer 218. Then, the second interlayer insulating layer 218 and the etch stop layer 216 are sequentially etched until the storage node contact plug 214 is exposed by using the mask pattern 220 as an etching mask, thereby, a storage node contact hole 222 is formed.

Figure 2C:
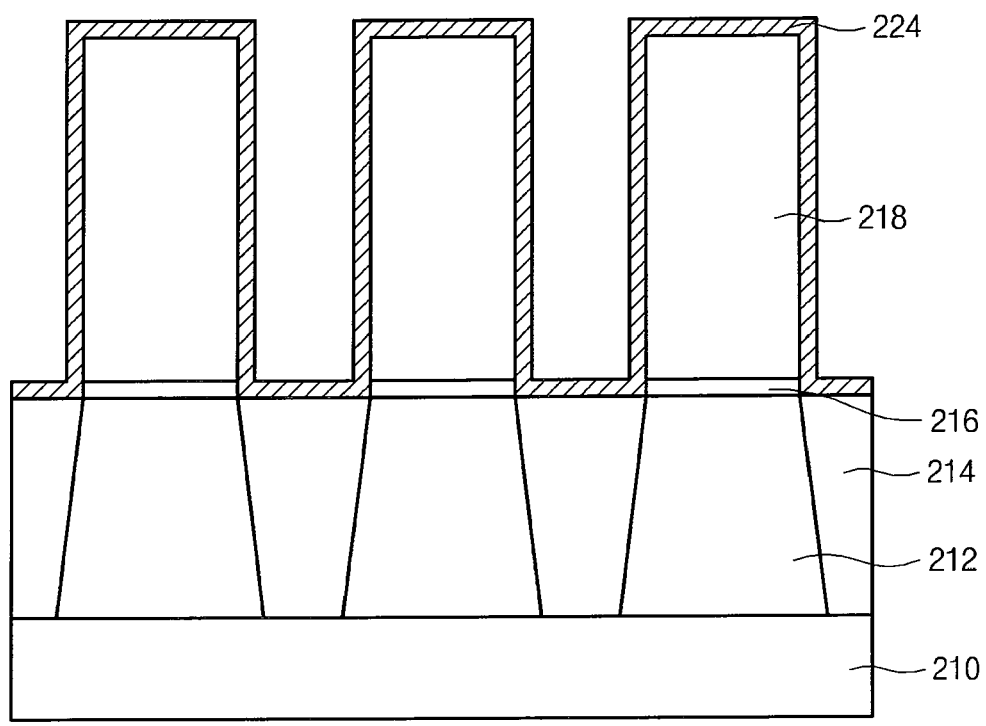

Referring to FIG. 2c, after the mask pattern 220 of FIG. 2b is removed, a first conductive layer 224 is formed on the exposed storage node contact plug 214, and the second interlayer insulating layer 218. At this time, the first conductive layer 224 is a conductive layer for the bottom plate, the first conductive layer 224 may be formed with a TiN layer.

Figure 2D:
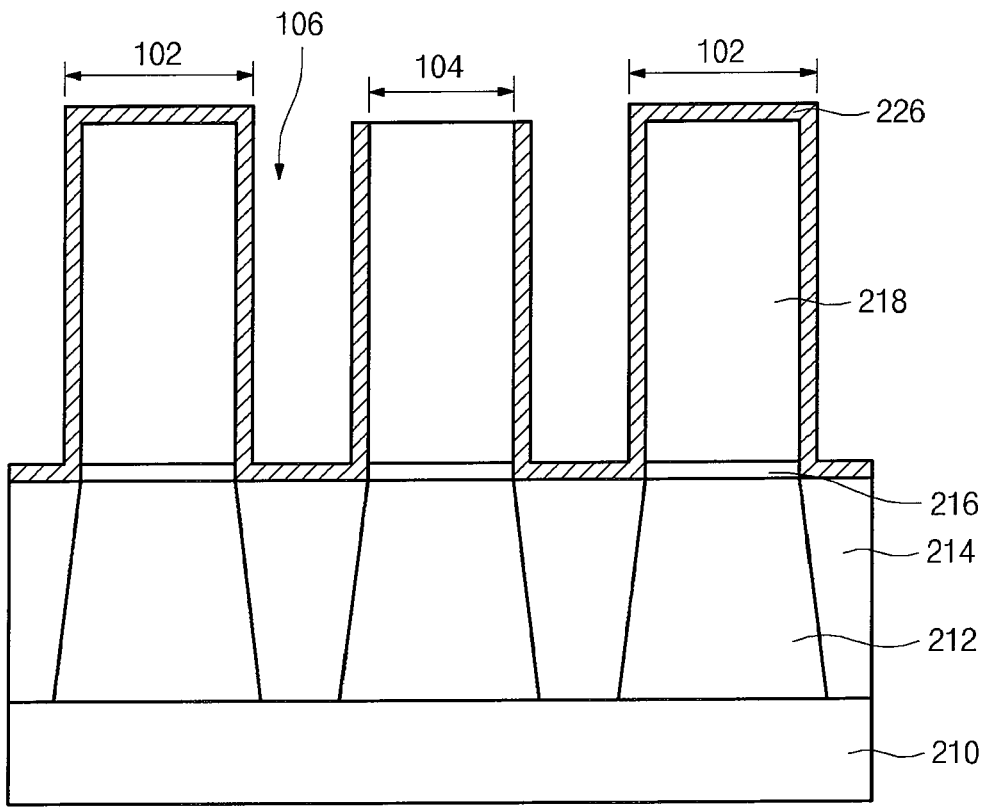

Referring to FIG. 2d, the first conductive layer 224 is selectively etched by using a first mask (not shown) in which the open region 104 is exposed like FIG. 1. That is, the first conductive layer 224 formed in the open area 104 is removed. Thus, a support pattern 226 in which the conductive layers formed on a plurality of adjacent storage node regions 106 are connected by the support region 102 is formed. That is, conventionally, the conductive layers for a bottom plate formed in each storage node region 106 were formed to be physically isolated, but in the present invention, these are connected by the support region 102 with a given number unit. At this time, the selective etching process for the open region 104 may be performed with the etch-back method.

Figure 2E:
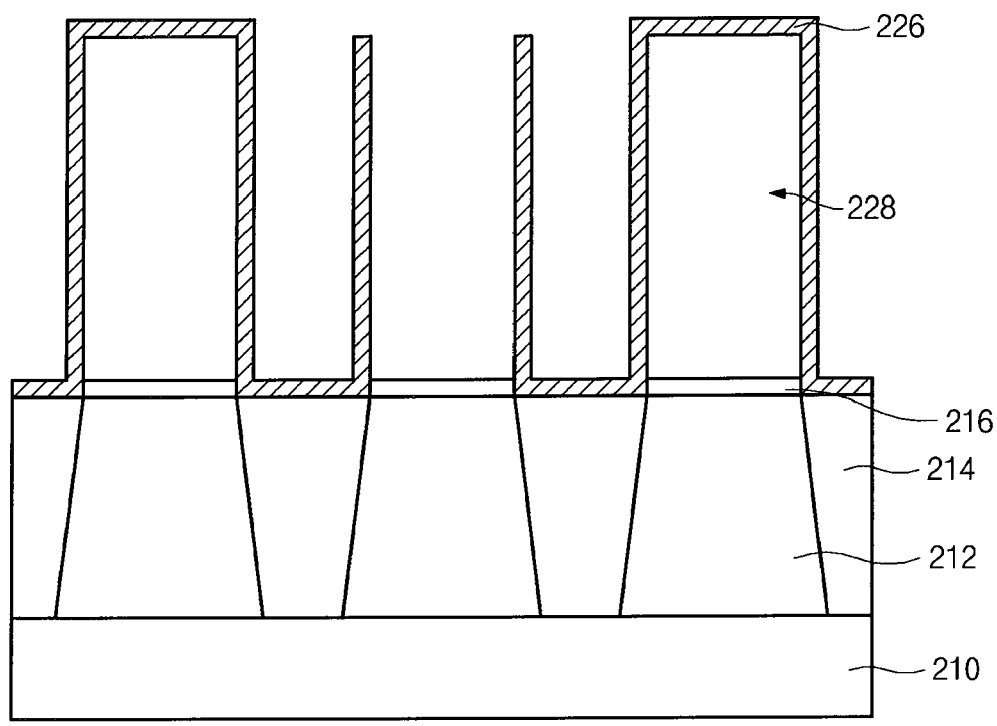

Referring to FIG. 2e, by performing the dip-out process for the outcome of FIG. 2d with the etch stop layer 216 as an etch barrier, the interlayer insulating layer 218 is substantially removed.

Figure 2F:
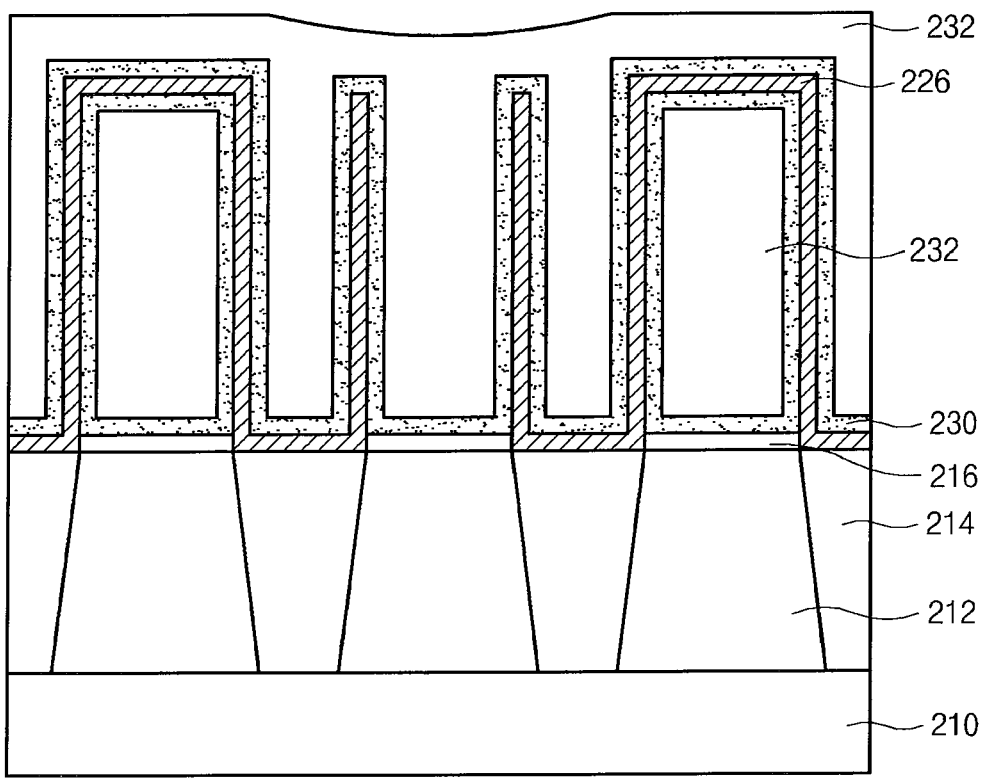

Referring to FIG. 2f, a dielectric layer 230 and a second conductive layer 232 are formed on the etch stop layer 216, on and below the support pattern 226. At this time, since the dielectric layer 230 and the second conductive layer 232 have an excellent step coverage characteristic, they are uniformly evaporated in an empty space 228 between the support patterns 226. In the meantime, the dielectric layer 230 may be formed with one of the oxide titanium $TiO_2$, the zirconium oxide $ZrO_2$, the hafnium oxide $HfO_2$, the aluminium oxide $Al_2O_3$ and combinations thereof. Further, the second conductive layer 232 may be formed with one of the polysilicon, the titanium nitride TiN, the ruthenium Ru and combinations thereof.

Figure 2G:
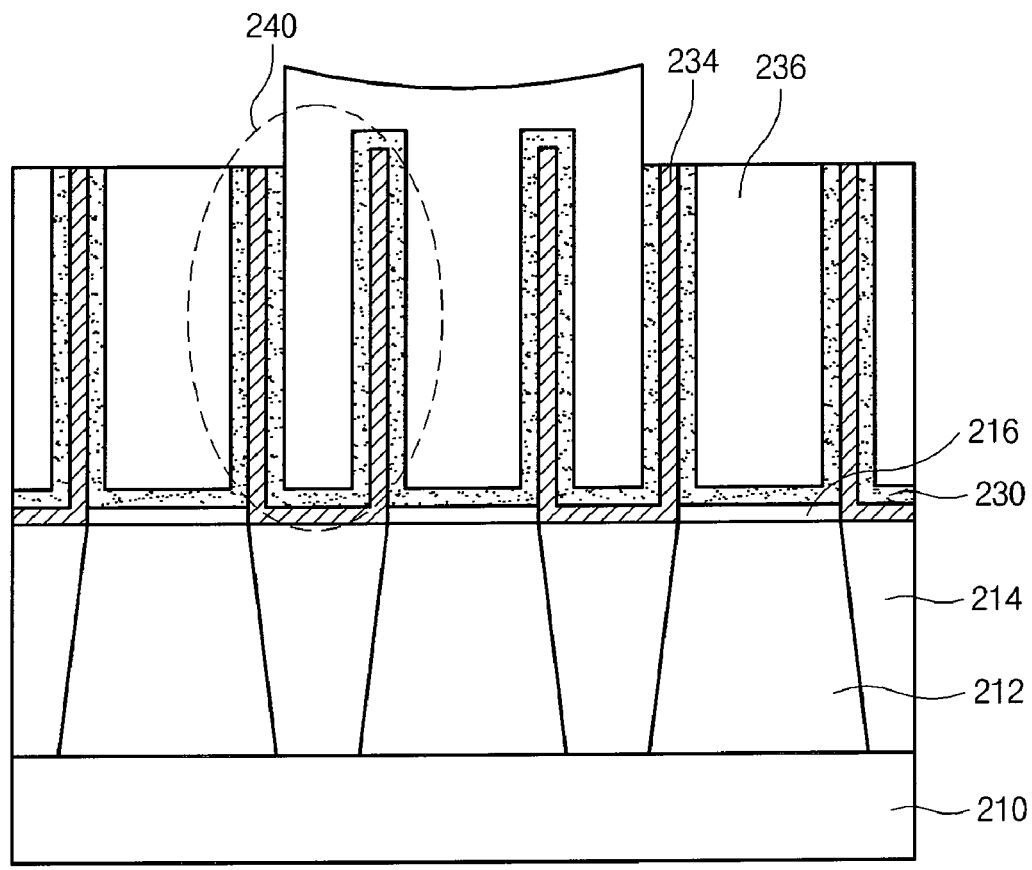

Referring to FIG. 2g, each capacitor 240 is isolated by selectively etching the second conductive layer 236, the dielectric layer 230 and the support pattern 226 of the support region 102, through using a second mask (not shown) exposing the support region 102 in FIG. 1. At this time, the capacitor 240 is formed with a cylinder type in which the dielectric layer 230 and the top plate 236 are laminated inside and outside of the bottom plate 234. Further, the bottom plate 234 is electrically isolated from the other adjacent bottom plate 234. The second mask can be formed with the opposite phase of the first mask in which the open region 104 is exposed. In addition, since the top plate 236 of the capacitor 240 is opened in the support region 102 of FIG. 1, the blocking phenomenon where the material such as hydrogen $H_2$ or nitrogen $N_2$ is unable to fall to the semiconductor substrate 210 in the subsequent heat treatment process can be relieved.

Figure 3:
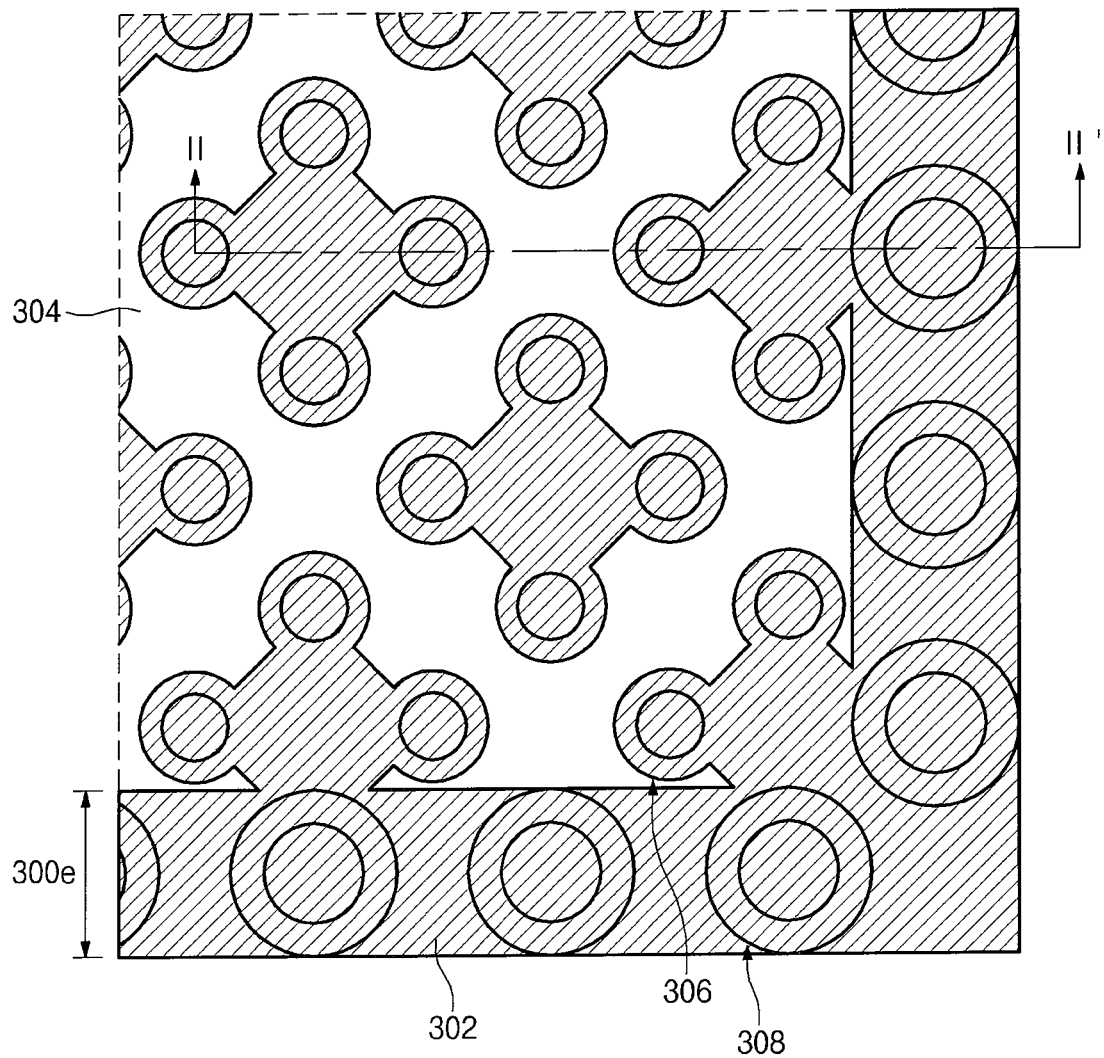
FIG. 3 is a drawing showing the patterning of the conductive layer for a bottom plate according to another embodiment of the present invention.

FIG. 3 is a drawing showing the patterning of the conductive layer for a bottom plate according to another embodiment of the present invention.

The pattern of FIG. 3 includes a dummy region 300e, a support region 302, an open region 304, a storage node region 306 and a dummy storage node region 308.

The support region 302 is a conductive layer region connecting the conductive layer of a plurality of adjacent storage node regions 306 in the cell mat region, and at the same time, connecting the conductive layer of the dummy storage node regions 308 which exists in the dummy region 300e.

The open region 304 shows the region in which the storage node regions 306 are not connected, that is, the region in which the conductive layer is removed.

Figure 4A:
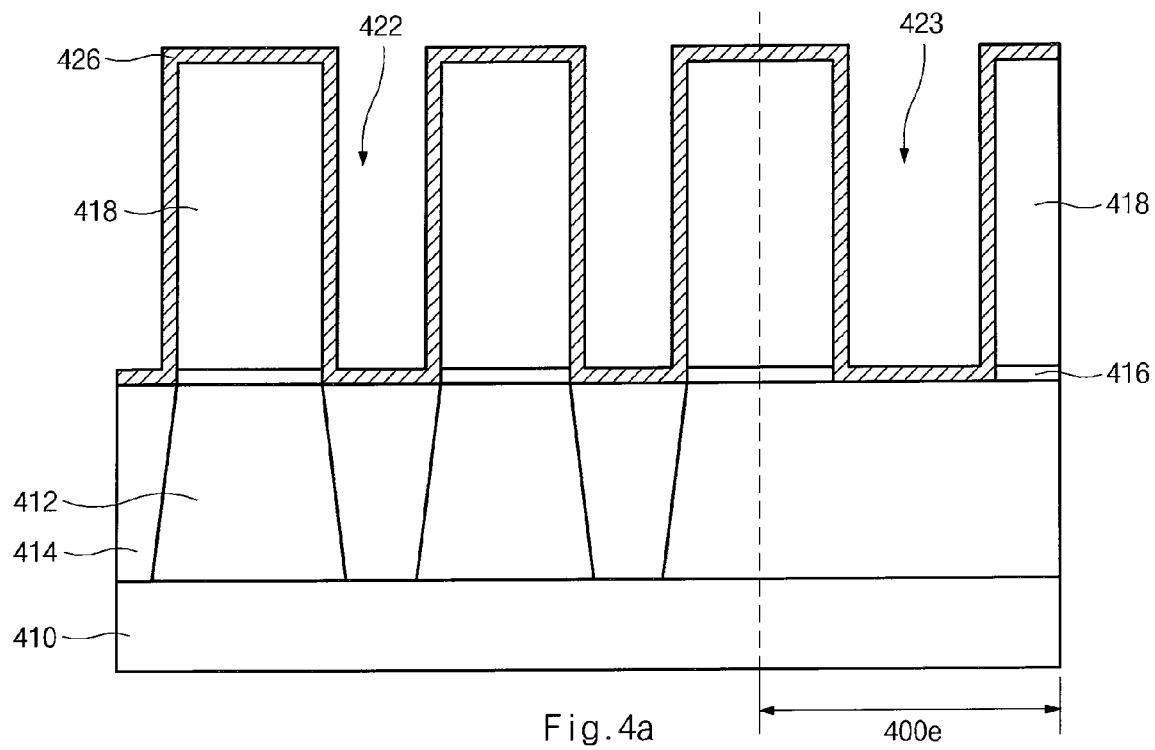
FIGS. 4a and 4b are cross-sectional views showing the manufacturing method of a semiconductor device according to another embodiment of the present invention.
Figure 4B:
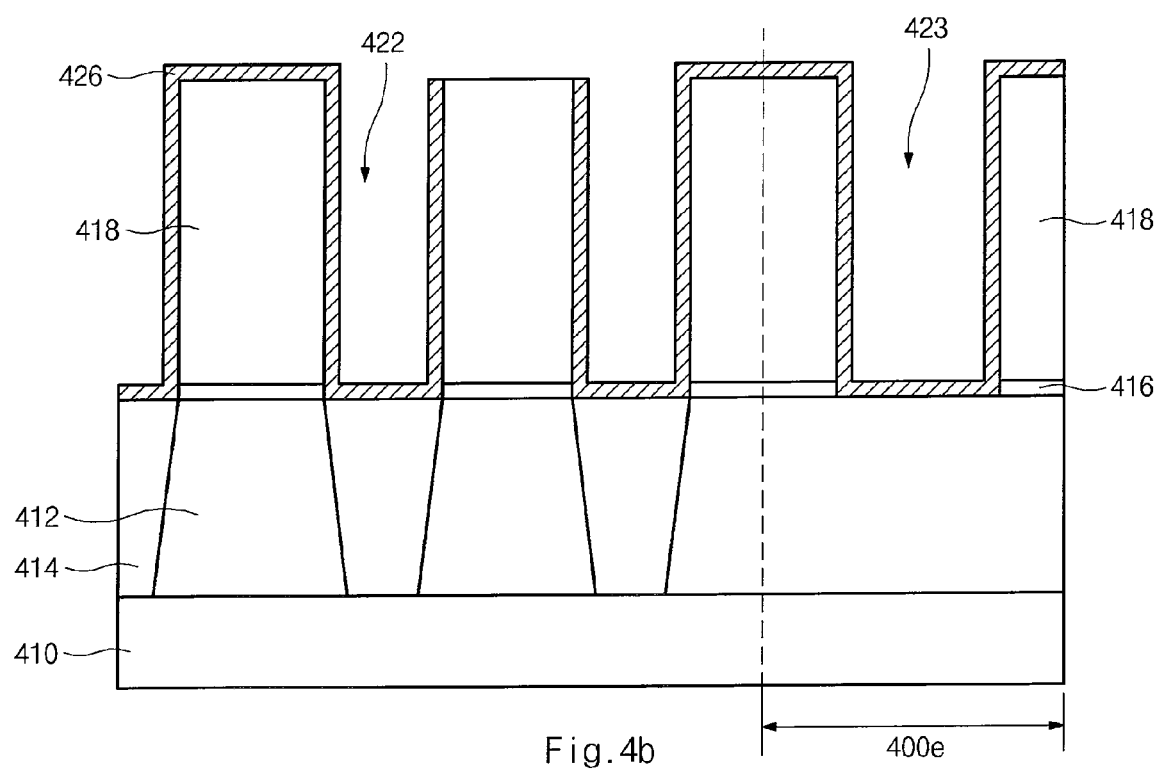

FIGS. 4a and 4b are the cross-sectional views according to the II-II' of FIG. 3, showing the manufacturing method of a semiconductor device according to another embodiment of the present invention.

Referring to FIGS. 4a and 4b, a first interlayer insulating layer 412 including a storage node contact plug 414 is formed on a semiconductor substrate 410. An etch stop layer 416 and a second interlayer insulating layer 418 are sequentially formed on the storage node contact plug 414 and the first interlayer insulating layer 412.

Then, by selectively etching the second interlayer insulating layer 418 and the etch stop layer 416 through using the mask (not shown) defining the dummy storage node region 308 within the dummy region 400e and the storage node region 306 of FIG. 3, a storage node contact hole 422 and a dummy storage node contact hole 423 are formed.

A conductive layer 424 is formed on the second interlayer insulating layer 418, the storage node contact hole 422 and the dummy storage node contact hole 423. Thereafter, by using the mask (not shown) exposing the open region 304 of FIG. 3, the conductive layer 424 of the open region 304 is removed to form the support pattern 426.

When the support pattern 426 of FIG. 3 and the support pattern 226 of FIG. 1 are compared, the support pattern 426 of FIG. 3 further includes the conductive layer which is formed in the whole dummy region 400e. That is, in the dummy region 400e, conductive layer formed in the dummy storage node regions 308 is not connected by a given number, but the pattern is formed so that the whole dummy region 400e might be connected to the conductive layer.

Then, the cylinder type capacitors are formed in the storage node region 306 and the dummy storage node region 308 by progressing the process like the above-described FIGS. 2e to 2g. At this time, as shown in FIG. 2g, when capacitors are isolated by eliminating the support region 302, the top plate which exists inside and outside of the bottom plate is isolated in the capacitors which are not used for the operation of a chip, for example, in the dummy capacitors which are in the edge of the cell mat. Like this, now that the bias voltage is only applied to the outside top plate when the bias voltage Vcp is applied to the top plate of the dummy region 400e by isolating the top plate of the capacitors which are not used for the operation of chip, the electrostatic capacity of corresponding capacitors decreased by about ½. Therefore, the parasitic capacitance is decreased and, thereby, on the whole, the characteristic of a chip can be improved.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a semiconductor device, the method comprising:
    forming storage node contact holes on an interlayer insulating layer formed over a semiconductor substrate;
    forming a first conductive layer on the interlayer insulating layer including the storage node contact holes and a dummy region;
    forming a support region conductive layer which selectively connects storage node region conductive layers formed in the storage node contact holes in the first conductive layer except the dummy region;
    removing the interlayer insulating layer;
    successively forming a dielectric layer and a second conductive layer over the surface of the storage node region conductive layers, the first conductive layer of the dummy region, and the support region conductive layer; and
    electrically isolating each storage node region conductive layer.

2. The method of claim 1, wherein removing the interlayer insulating layer comprises performing a dip-out process.

3. The method of claim 1, wherein the first conductive layer includes a TiN layer.

4. The method of claim 1, wherein the dielectric layer includes an oxide titanium $TiO_2$ layer, a zirconium oxide $ZrO_2$ layer, a hafnium oxide $HfO_2$ layer, an aluminium oxide $Al_2O_3$ layer, or combinations thereof.

5. The method of claim 1, wherein the second conductive layer includes a polysilicon layer, a titanium nitride TiN layer, a ruthenium Ru layer, or combinations thereof.

6. The method of claim 1, wherein the support region conductive layer connects the adjacent storage node region conductive layers by a predetermined number, and connects all the dummy storage node region conductive layers.

7. The method of claim 6, wherein the support region conductive layer connects the storage node region conductive layers which are adjacent to the dummy region with the dummy storage node region conductive layers.

8. The method of claim 1, wherein electrically isolating each storage node region conductive layer comprises removing the support region conductive layer, and the second conductive layer and the dielectric layer formed on the surface of the support region conductive layer.

9. The semiconductor device of claim 8, wherein, in the removing of the second conductive layer, the second conductive layer formed inside of the dummy storage node conductive layer and the second conductive layer formed outside of the dummy storage node conductive layer are isolated from each other.

* * * * *